United States Patent [19]
Ina et al.

[11] Patent Number: 5,808,724
[45] Date of Patent: Sep. 15, 1998

[54] ILLUMINATION METHOD AND SYSTEM HAVING A FIRST OPTICAL ELEMENT AT A POSITION OPTICALLY CONJUGATE WITH AN OBJECT AND A SECOND OPTICAL ELEMENT CLOSER TO THE OBJECT AND ON A PUPIL PLANE OF THE SYSTEM

[75] Inventors: Hideki Ina; Tsuneo Kanda, both of Utsunomiya, Japan

[73] Assignee: Canon Kabushiki Kaisha, Tokyo, Japan

[21] Appl. No.: 620,644

[22] Filed: Mar. 22, 1996

[30] Foreign Application Priority Data

Mar. 24, 1995 [JP] Japan ................... 7-091802

[51] Int. Cl.⁶ ............... G03B 27/42; G01B 11/00
[52] U.S. Cl. ............... 355/53; 356/400; 356/401
[58] Field of Search ................ 355/53, 67, 71; 356/399, 400, 401

[56] References Cited

U.S. PATENT DOCUMENTS

| | | | |
|---|---|---|---|
| 4,497,015 | 1/1985 | Konno et al. | 362/268 |
| 4,634,240 | 1/1987 | Suzuki et al. | 350/508 |
| 4,645,924 | 2/1987 | Suzuki et al. | 250/236 |
| 4,669,883 | 6/1987 | Ina et al. | 356/401 |
| 4,834,540 | 5/1989 | Totsuka et al. | 356/401 |
| 4,861,162 | 8/1989 | Ina | 356/401 |
| 4,862,008 | 8/1989 | Oshido et al. | 356/401 X |
| 4,886,974 | 12/1989 | Ina | 250/561 |
| 4,901,109 | 2/1990 | Mitome et al. | 355/68 |
| 5,133,603 | 7/1992 | Suzuki et al. | 356/400 |
| 5,137,363 | 8/1992 | Kosugi et al. | 356/401 |
| 5,309,197 | 5/1994 | Mori et al. | 355/53 |
| 5,323,207 | 6/1994 | Ina | 355/53 |
| 5,371,570 | 12/1994 | Morris et al. | 355/53 |
| 5,383,000 | 1/1995 | Michaloski et al. | 355/53 X |

FOREIGN PATENT DOCUMENTS

| | | |
|---|---|---|
| 62-232504 | 10/1987 | Japan . |
| 63-44813 | 3/1988 | Japan . |
| 03-61802 | 3/1991 | Japan . |

*Primary Examiner*—Fred L. Braun
*Attorney, Agent, or Firm*—Fitzpatrick, Cella, Harper & Scinto

[57] ABSTRACT

An illumination system for illuminating an object, such as a system for detecting an alignment mark on a semiconductor wafer. The system includes a light source and an illumination optical system for directing light from the light source toward an object to be illuminated. A first optical element, which preferably is a hologram, is provided in a portion of the light path of the illumination optical system at a position optically conjugate with the object and has a function of amplitude-dividing the light and deflecting a divided light ray. A second optical element, which also preferably is a hologram, is provided in a portion of the light path that is closer to the object as compared to the first optical element and is disposed on a pupil plane of the illumination optical system. The second optical element also has a function of amplitude-dividing the light and deflecting a divided light ray.

20 Claims, 10 Drawing Sheets

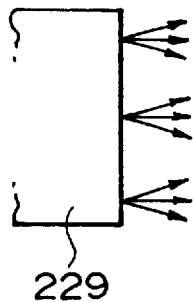
F I G. 8
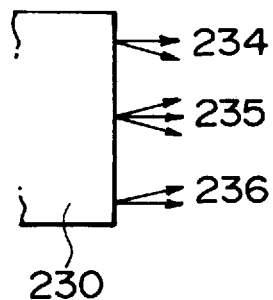
F I G. 9
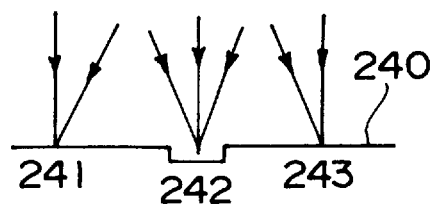
F I G. 10
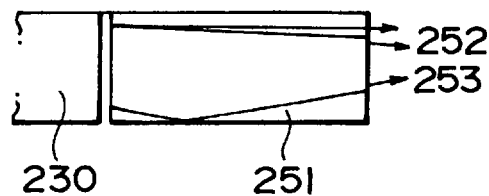
F I G. 11

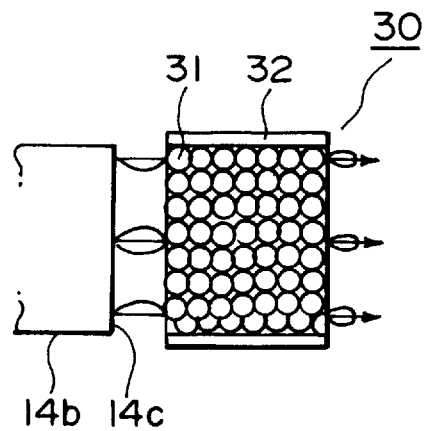
F I G. 18
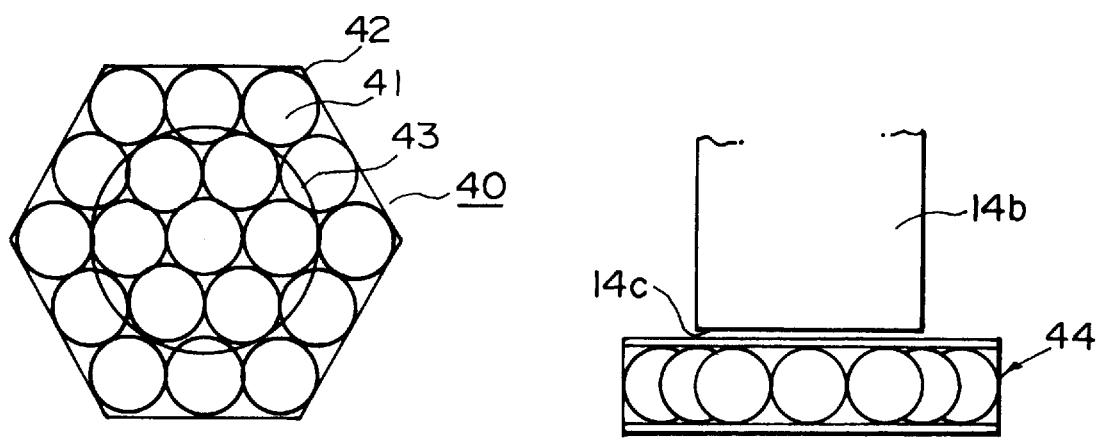
F I G. 19A  F I G. 19B

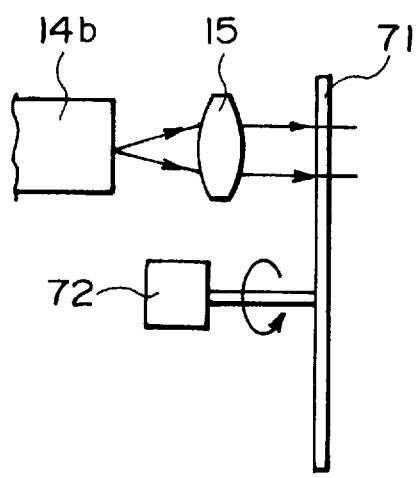 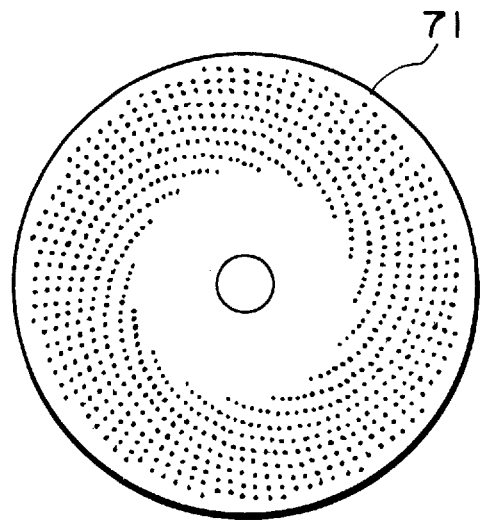
FIG. 22A          FIG. 22B
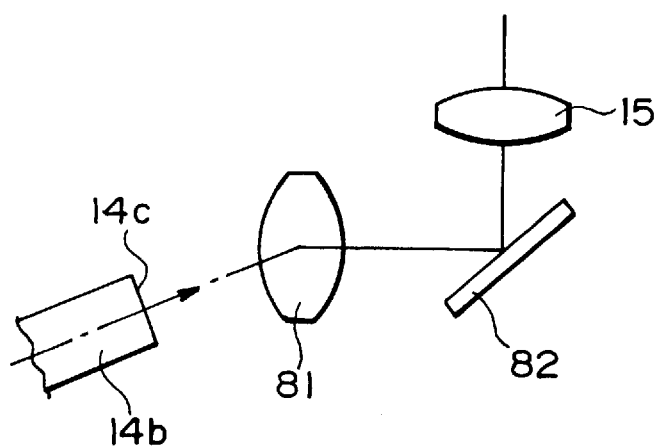
FIG. 23

ILLUMINATION METHOD AND SYSTEM HAVING A FIRST OPTICAL ELEMENT AT A POSITION OPTICALLY CONJUGATE WITH AN OBJECT AND A SECOND OPTICAL ELEMENT CLOSER TO THE OBJECT AND ON A PUPIL PLANE OF THE SYSTEM

FIELD OF THE INVENTION AND RELATED ART

This invention relates to an illumination system and, more particularly, to an illumination system suitably usable for the production of high density semiconductor devices by printing, with projection exposure, a fine electronic circuit pattern (such as an IC or LSI pattern) of a reticle or mask upon a wafer through a projection lens system (projection optical system). The illumination system of the present invention may be used to illuminate and observe the state of (alignment mark or marks) of the surface of the mask or wafer, on the basis of which the reticle and the wafer may be aligned with each other.

In reduction projection type exposure apparatuses for the manufacture of semiconductor devices, a circuit pattern of a reticle (first object) is printed on a wafer (second object) by projection exposure through a projection lens system. Prior to such projection exposure, the surface of the wafer is observed by means of an observation system (detecting means), and an alignment mark or marks of the wafer are detected. On the basis of the result of the detection, the relative position of the reticle and the wafer is adjusted. This is called an "alignment process".

The precision of the alignment process largely depends on the optical performance of the observation system and, thus, the performance of the observation system is one of the major factors of the exposure apparatus.

Recently, many proposals have been made regarding high density semiconductor device manufacturing exposure apparatuses using a phase shift mask or a modified illumination process. In such exposure apparatuses, higher alignment precision is required.

Conventionally, there are three types of alignment mark (wafer mark) observation methods for obtaining positional information related to the wafer surface, such as follows:

(1a) Off-axis method: non-exposure light (non-sensitizing light) is used and the observation is made without intervention of a projection lens system;

(1b) Exposure light TTL method: exposure light (sensitizing light) is used and the observation is made through a projection lens system; and (1c) Non-exposure light TTL method: non-exposure light (non-sensitizing light) is used and the observation is made through a projection lens system.

As a proposal related to one of these three observation methods, Japanese Laid-Open Patent Application, Laid-Open No. 61802/1991, filed in Japan by the same assignee of the subject application, has proposed an alignment system using an observation system based on the non-exposure light TTL method.

In this observation system, an optical image of an alignment mark (wafer mark) on the surface of a wafer, is formed on an image pickup device such as a CCD camera, and imagewise information produced by the image pickup device is processed by which the position of the wafer mark is detected.

Japanese Laid-Open Patent Application, Laid-Open No. 232504/1987, filed in Japan by the same assignee of the subject application, has proposed a position detecting system wherein an optical image of a wafer mark is taken by a CCD camera, and imagewise information produced by the CCD camera is binarized. A template matching procedure using a template is then performed with respect to the positional coordinates of a particular imagewise pattern, of the binarized image, by which the position of the wafer mark is detected.

FIG. 1 is a schematic view of a main portion of an exposure apparatus having a known type of observation system. Denoted in this drawing at 8 is a reticle (first object) which is placed on a reticle stage 10. Denoted at 3 is a wafer (second object) on which an alignment mark or AA mark (Auto-Alignment mark) 4 to be used for the alignment process is formed. Denoted at 5 is a projection optical system which comprises a projection lens system, for projecting a circuit pattern or the like of the reticle (mask) 8 onto the surface of the wafer 3.

Denoted at 9 is an illumination system for illuminating the reticle 8 with exposure light (sensitizing light). Denoted at 2 is a θ-Z stage on which the wafer 3 is placed. It is arranged to perform θ rotation of and focus adjustment (adjustment in the Z direction) of the wafer 3. The θ-Z stage 2 is placed on an X-Y stage 1 which is arranged to perform high precision stepwise motion. Mounted on the X-Y stage 1 is an optical square (bar mirror) 6 which functions as a reference for measurement of the position of the stage. This optical square is monitored by means of a laser interferometer 7.

The alignment operation for the reticle 8 and the wafer 3 is performed indirectly by aligning each of the reticle and the wafer with a reference mark 17 whose positional relationship is predetermined. Details of this reference mark 17 will be described later. Denoted at 101 is a detecting means which comprises an illumination system and an observation system, for detecting the relative position of the reticle 8 and the wafer 3.

In the arrangement of FIG. 1, a light beam from light source means 14a comprising a halogen lamp and an elliptical mirror, is directed by a fiber 14b and it is projected out of a light exit surface 14c of the fiber 14b. Non-exposure (non-sensitizing) light, that is, detection light, emitted from the light exit surface 14c goes by way of a lens 15, a beam splitter 16, an objective lens 12, a mirror 11 and the projection lens system 5, in this order, and it illuminates the AA mark (alignment mark) 4 of the wafer 3. Observed image information of the AA mark 4 of the wafer 3 is imaged upon a CCD camera 22, by way of the projection lens system 5, the mirror 11, the objective lens 12, the beam splitter 16, another beam splitter 20 and an erector lens 21, in this order.

The projection lens system 5 has been corrected satisfactorily with respect to the exposure light (sensitizing light) in order that an electronic circuit pattern formed on the reticle 8 is printed upon the wafer 3 through projection exposure. For this reason, when non-exposure (non-sensitizing) light goes through the projection lens system 5, various aberrations are produced.

In the arrangement of FIG. 1, the aberrations produced by the projection lens system 5 are corrected by the objective lens 12 so that a good observation image of the AA mark 4 is formed on the CCD camera 22.

On the other hand, the reference mark 17 is illuminated by the light coming from a reference mark illuminating light source (LED) 19, which light is collected by a lens 18. The reference mark as illuminated is imaged upon the CCD camera 22 by way of the beam splitter 20 and the erector lens 21.

The position, on the CCD camera 22, of the AA mark 4 of the wafer 3 as imaged on the CCD camera 22 is measured by means of a signal processing system (not shown). Here, the reference mark 17 which is fixed is imaged on the CCD camera 22, too. The position thereof on the CCD camera is measured by means of the signal processing system. Thus, by comparing the position of the imaged AA mark 4 with the position of the projected image of the reference mark 17, correct positional information related to the X-Y stage is produced, on the basis of which high precision alignment is performed.

In many cases, a stable light source such as a halogen lamp or He-Ne laser is used as a light source for the observation of AA marks of a wafer. Light from such a light source is guided by a fiber and is directed through an optical system, whereby an alignment mark (AA mark) of a wafer is illuminated.

Here, there are two types of uniformness, to be described below, as the factors for evaluating the performance of illumination of the alignment mark. For high precision alignment detection, both of these two types of uniformness are important.

One is the uniformness upon the surface being illuminated. Usually, this is called "illuminance non-uniformness", and it corresponds to the uniformness of intensity upon the surface being illuminated.

The other is the uniformness upon the pupil plane. This is essential for high precision alignment. When the uniformness on the pupil plane is expressed in terms of the surface being illuminated (or observed), it is the uniformness of illumination light, on the surface being illuminated, of different angles.

For alignment precision, among the uniformness of intensity upon the pupil plane, the symmetry of direction of detection with respect to the direction of advancement of diffraction light is most important. If the intensity on the pupil plane is not symmetrical, there occurs asymmetrical distortion in the signal waveform of an imaged alignment mark as received by a CCD camera even though the optical system of the imaging system does not have aberration of coma. This distortion creates an alignment offset and, if there is non-uniformness such as irregular thickness of a thin film within a wafer, it causes dispersion of alignment precision (degradation of 3σ). Practically, these two types of non-uniformness are not separated, and they are superposed when observed.

FIGS. 2–7 show a case where a detected waveform produced by detection of an alignment mark within the observation field is non-uniform.

As illustrated in FIGS. 2–4, for observation of an alignment mark, the alignment mark is displaced within the view field of a CCD camera from the left to the center and to the right, as viewed in the drawings. FIGS. 5–7 show corresponding waveforms detected, respectively. When the alignment mark is at the central position (FIG. 3), the detected waveform is symmetrical (it has uniform hollows 220 and 221). When the alignment mark is at the left hand position (FIG. 2), the detected waveform is distorted (hollow 221 is deeper than hollow 222). Also, when the alignment mark is at the right hand position (FIG. 4), the detected waveform has distortion, inverse to that of the waveform of FIG. 5, that is, hollow 225 is deeper than hollow 224. This is because the non-uniformness upon the pupil plane changes with the position upon the surface being illuminated.

As described, in addition to the problem of asymmetry of a signal, there is a problem of a non-uniform waveform produced within the observation view field, causing deterioration of alignment precision.

In recent evaluation processes for evaluation of an automatic alignment system, such non-uniformness within the observation view field is quantified as TIS (Tool Induced Offset). One of the factors that causes a non-uniform detection waveform within the view field is non-uniformness of the angular characteristic of a fiber used in the illumination system.

FIG. 8 shows a case where a fiber 229 has a uniform angular characteristic, and FIG. 9 shows a case where a fiber 230 has a non-uniform angular characteristic. In the case of FIG. 9 (non-uniform angular characteristic), the light rays 235 at the central portion expand with uniform angles. On the other hand, the light rays 234 at the upper portion expand only downwardly whereas the light rays 236 at the lower portion expand only upwardly.

FIG. 10 shows the result when this fiber 230 is disposed at a pupil plane of an illumination system to provide Kohler illumination. As illustrated, the left hand portion 241 of an object 240 being observed is irradiated mainly with the light coming from the right, while the right hand portion 243 of the object 240 is irradiated mainly with the light coming from the left. If there is a directionality in the light scattering characteristic due to the structure of a step (surface level difference) of an alignment mark, for example, or if the observation system has spherical aberration (it may be as designed or it may be caused by an error in the manufacture), for example, then a resultant light distribution is biased. In such a case, a detected waveform is distorted as if it results from the aberration of coma. Distortion of the detected waveform ends in failure of correct measurement of the position of an alignment mark, thus causing degradation of alignment precision.

Generally, it is very difficult to remove such non-uniformness of a fiber as described. Some attempts have been proposed to reduce the non-uniformness resulting from the use of a fiber. As an example, U.S. Pat. No. 4,497,015 proposes an illumination system for an exposure apparatus wherein two fly's-eye lenses are used so that these two types of uniformness are kept good. However, it requires the use of a bulky and complicated observation system.

Another proposal is shown in FIG. 11 wherein, for uniformity, an optical pipe (optical rod) 251 is provided at the light exit surface of a fiber 230. In this method, however, as regards light rays with a small angle such as light rays 252, there is a possibility that a light ray not reflected within the optical pipe 251 is used for the illumination. This means reduced efficiency of uniformity by the use of the optical pipe.

Another proposal is the use of a diffusion plate in a light path of an illumination system. In this method, however, the light quantity becomes one half (or not less than one-fifth, in a worst case). Thus, a high power light source has to be used.

Another proposal has been made in Japanese Published Utility Model Application, Publication No. 44813/1988, wherein two diffusion plates are placed at positions optically conjugate with an image plane and a pupil plane. In this method, however, there occurs a large loss of light quantity.

A high efficiency diffusion plate such as a lemon-skin filter or a non-reflection glass may be used. In this method, however, although the efficiency of light utilization may be higher than that as provided by an ordinary diffusion plate, as a general principle, the light utilization efficiency is lowered to one half or less.

SUMMARY OF THE INVENTION

It is accordingly an object of the present invention to provide an illumination system by which the surface of an object, such as a first object (e.g., a reticle) or a second object (e.g., a wafer) can be illuminated with higher efficiency of light utilization.

It is another object of the present invention to provide an observation system by which an alignment mark on the surface of an object can be observed satisfactorily.

It is a further object of the present invention to provide a projection exposure apparatus by which a reticle and a wafer can be aligned with each other with good precision and by which a pattern of the reticle can be projected on the wafer with good resolution.

It is a yet further object of the present invention to provide a device manufacturing method by which microdevices such as semiconductor devices can be produced with a good throughput.

In accordance with an aspect of the present invention, there is provided an illumination system for illuminating an object, comprising: light source means for providing light; an illumination optical system for directing the light from said light source means toward the object to illuminate the same; and an optical element provided in a portion of a light path of said illumination optical system and at a position optically conjugate with the object with respect to said illumination optical system, said optical element having a function for amplitude-dividing the light and for deflecting a divided light ray to a predetermined direction.

The illumination system in this aspect of the present invention may further comprise a second optical element having the same function as that of said optical element, wherein said second optical element is disposed at a pupil plane of said illumination optical system.

The illumination system in this aspect of the present invention may further comprise a fiber for directing the light from said light source means to said illumination optical system. Said fiber may have a light exit surface disposed at a pupil plane of said illumination optical system.

The illumination system in this aspect of the present invention may further comprise an optical pipe disposed in a portion of a light path between said illumination optical system and said light exit surface of said fiber, wherein said optical pipe may have a light exit surface disposed at the pupil plane of said illumination optical system.

The optical element may comprise an arithmetic hologram, or it may comprise a phase type hologram.

In accordance with another aspect of the present invention, there is provided an illumination system for illuminating an object, comprising: light source means for providing light; an illumination optical system for directing the light from said light source means toward the object to illuminate the same; and a fiber for directing the light from said light source to said illumination optical system; and a uniforming member disposed at a light exit side of said fiber and having a plurality of transparent elements accommodated in a casing, wherein said transparent elements have one of a semi-spherical shape and a spherical shape and wherein said uniforming member has a light exit surface disposed at a pupil plane of said illumination optical system.

In accordance with a further aspect of the present invention, there is provided an illumination system for illuminating an object, comprising: light source means for providing light; an illumination optical system for directing the light from said light source means toward the object to illuminate the same; a fiber for directing the light from said light source means to said illumination optical system; and a rotatable member disposed at a light exit side of said fiber and having a plurality of openings for transmitting the light from said fiber, wherein said rotatable member has a light exit surface disposed at a pupil plane of said illumination optical system.

The openings of said rotatable member may be defined by pinholes distributed like an eddy.

Also, the openings of said rotatable member may provide a transmission type diffraction grating.

In accordance with a yet further aspect of the present invention, there is provided an illumination system for illuminating an object, comprising: light source means for providing light; an illumination optical system for directing the light from said light source means toward the object to illuminate the same; a fiber for directing the light from said light source means to said illumination optical system; and a digital micromirror device disposed in a Scheimpflug's condition with a light exit surface of said fiber, with intervention of an optical system.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 8 is a schematic view for explaining an intensity distribution of light emitted from a fiber.

FIG. 9 is a schematic view for explaining another example of an intensity distribution of light emitted from a fiber.

FIG. 10 is a schematic view for explaining light incident on the surface of an object, in a case where a fiber having non-uniform angular characteristic is used.

FIG. 11 is a schematic view for explaining light passing through a fiber and an optical pipe.

FIG. 18 is an enlarged view of a portion of the FIG. 17 embodiment.

FIGS. 19A and 19B are schematic views, respectively, for explaining another example of a sphere member structure of the FIG. 17 embodiment.

FIGS. 22A and 22B are schematic views, respectively, of a main portion of an illumination system according to a fourth embodiment of the present invention.

FIG. 23 is a schematic view of a main portion of an illumination system according to a fifth embodiment of the present invention.

DESCRIPTION OF THE PREFERRED EMBODIMENTS

Figure 1:
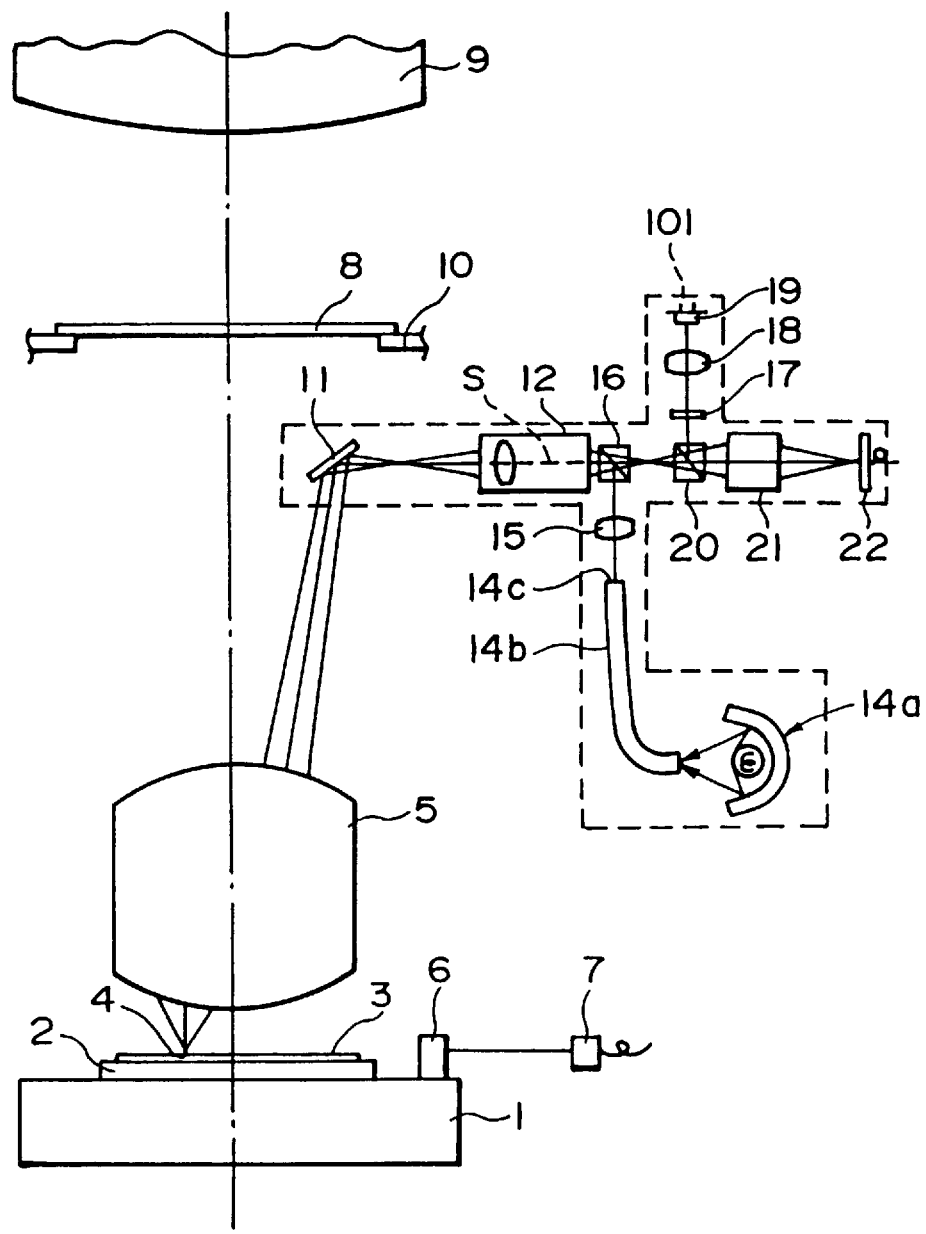
FIG. 1 is a schematic view of a main portion of a known type projection exposure apparatus.
Figure 2:
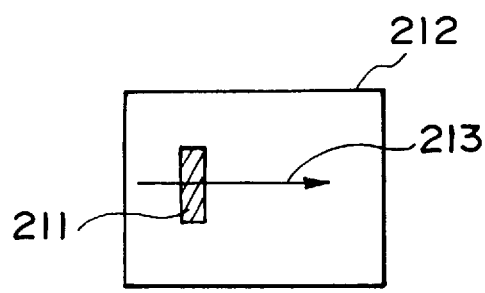
FIGS. 2–4 are schematic views, respectively, for explaining observation of an alignment mark with a CCD camera.
Figure 3:
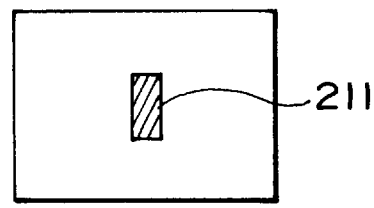
Figure 4:
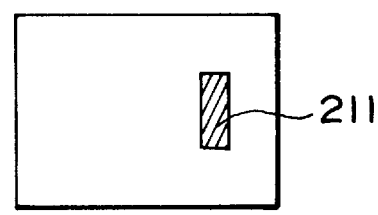
Figure 5:
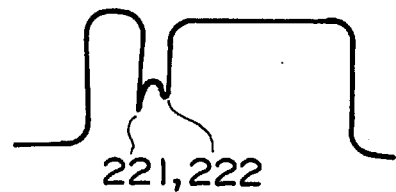
FIGS. 5–7 are waveform views, respectively, for explaining detected waveforms corresponding to the alignment mark observation as illustrated in FIGS. 2–4, respectively.
Figure 6:
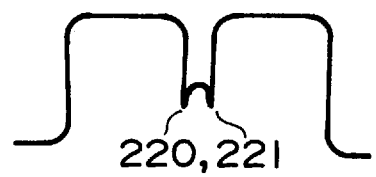
Figure 7:
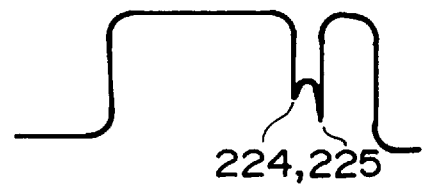
Figure 12:
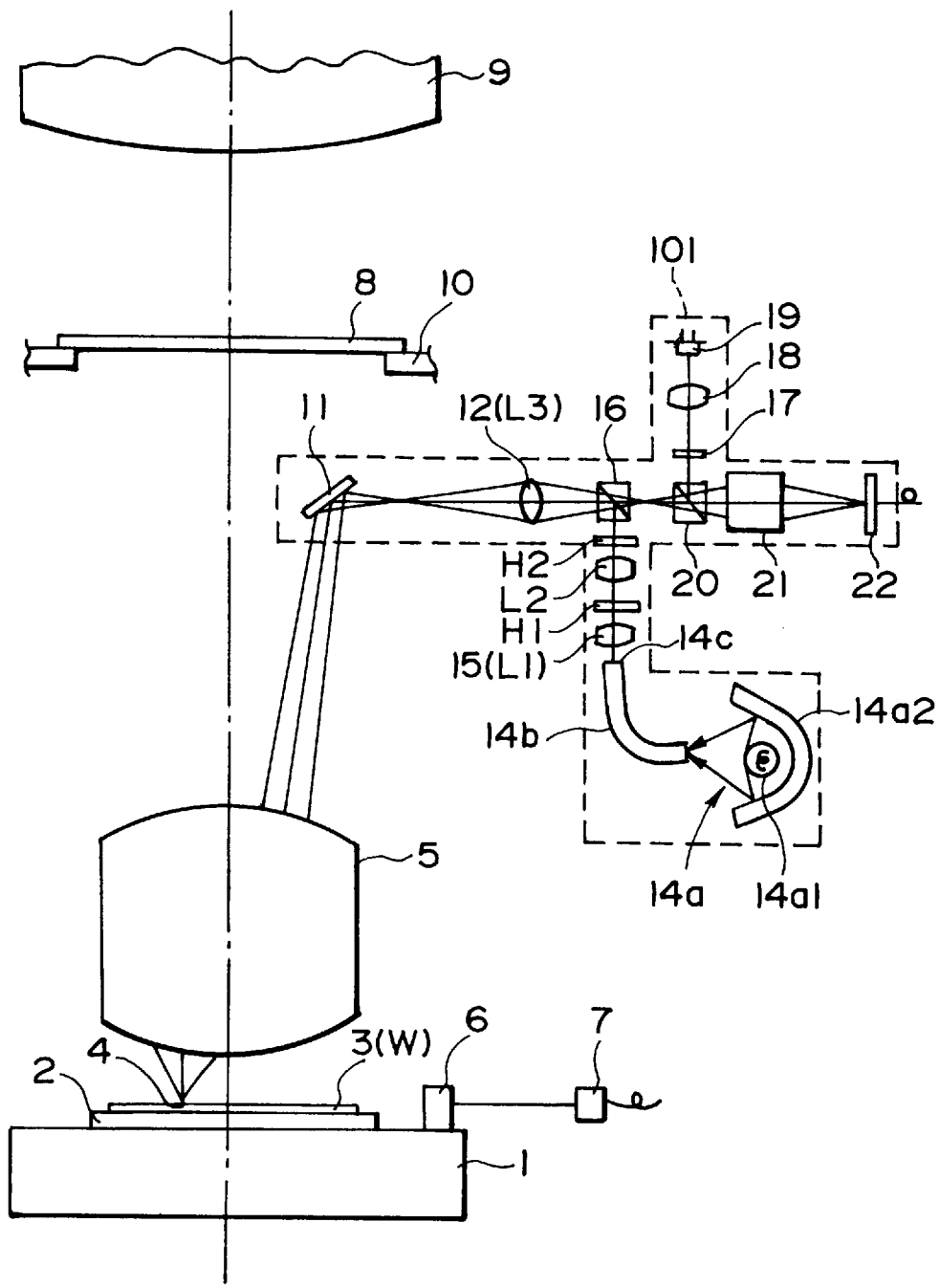
FIG. 12 is a schematic view of a main portion of a projection exposure apparatus according to a first embodiment of the present invention.
Figure 13:
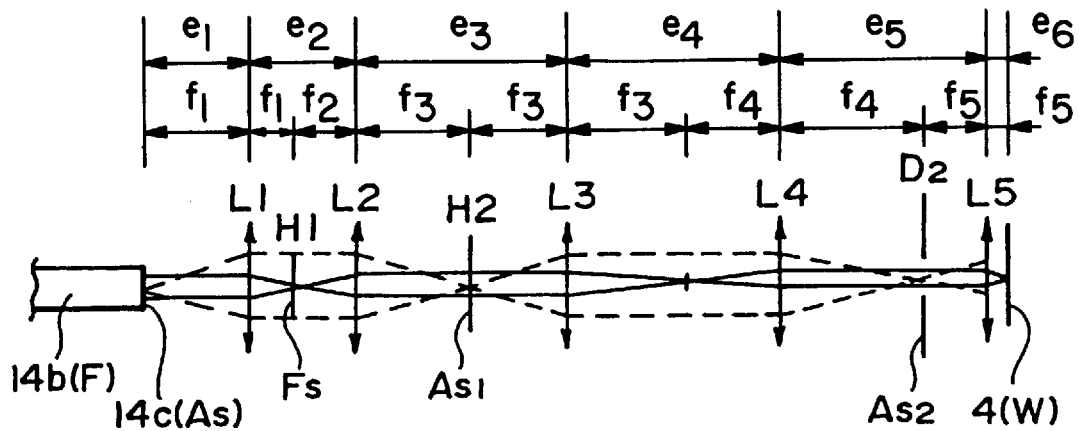
FIG. 13 is a schematic view of an illumination system of the FIG. 12 embodiment.

FIG. 12 is a schematic view of a main portion of an optical arrangement according to a first embodiment of the present invention, wherein the invention is applied to a projection exposure apparatus for the production of semiconductor devices, for example. FIG. 13 is a schematic view of an illumination system of the FIG. 12 embodiment, wherein the optical arrangement of the illumination system is represented by five thin lens systems. In FIG. 13, broken lines depict the optically conjugate relationship in relation to a pupil of the illumination system, and solid lines depict the optically conjugate relationship in relation to an object plane 4.

Denoted in FIG. 12 at 8 is a reticle (first object) which is placed on a reticle stage 10. Denoted at 3 is a wafer (second object) on which an alignment mark (AA mark) 4 is formed. Denoted at 5 is a projection optical system which comprises, in this example, a projection lens system for projecting a pattern (such as an electronic circuit pattern) of the reticle (or mask) 8 onto the wafer 3 surface. The projection lens system 5 comprises a telecentric system both on the reticle 8 side and on the wafer 3 side.

Denoted at 9 is an illumination system for projection exposure. It serves to illuminate the reticle 8 with exposure light (sensitizing light). Denoted at 2 is a θ-Z stage on which the wafer 3 is placed. It serves to perform rotational adjustment of the wafer 3 as well as focus adjustment (adjustment in the Z direction) of the wafer. The θ-Z stage is placed on an X-Y stage 1 which performs high precision stepwise motion. Mounted on the X-Y stage 1 is an optical square (bar mirror) 6 which functions as a reference for measurement of the position of the stage. This optical square is monitored by means of a laser interferometer 7.

The alignment operation for the reticle 8 and the wafer 3 is performed indirectly, in this embodiment, by aligning each of the reticle and the wafer with a reference mark 17 whose positional relationship is predetermined. Practically, offset measurement is done by measuring, after alignment, an alignment error (offset) of a printed resist image pattern, for example. The thus measured error is used as an offset, in the succeeding procedure.

Now, the components of detecting means 101 which serves to detect the position of the AA mark 4 on the wafer 3 surface in accordance with the non-exposure light TTL method, will be explained. It is to be noted that the exposure light TTL method or the off-axis method is usable in this embodiment.

Denoted at 14a is light source means for detection (illumination) of the mark 4. It comprises a halogen lamp $14a_1$ and an elliptical mirror $14a_2$, wherein the lamp $14a_1$ produces light (non-exposure or non-sensitizing light) of a wavelength different from that of the light to be used for the exposure (printing) process. Denoted at 14b is a fiber (fiber bundle) for guiding the light from the light source 14a. From a light exit surface 14c thereof, the light is emitted.

Denoted at 15 (L1) is a lens which serves to collect the light (detection light) from the light exit surface 14c of the fiber 14b and to project the same to a lens L2 through a hologram H1. A light beam incident on the lens L2 is then projected on a hologram H2 which is disposed between the lens L2 and a beam splitter 16. After this, the light beam is projected on an objective lens 12.

Here, as shown in FIG. 13, the hologram H1 is disposed at a plane Fs which is optically conjugate with the wafer (object) 3 whose surface is to be illuminated. Also, the hologram H2 is disposed at a pupil plane As of the illumination system (corresponding to a light exit surface 16c) or a plane $As_1$ which is optically conjugate therewith.

Light as reflected by the beam splitter 16 is collected by the objective lens 12, and is reflected by a mirror 11. The reflected light is directed through the projection lens system 5 to illuminate the mark 4 on the wafer 3 surface. The fiber 14b, the lens 15 and the objective lens 12 are components of the illumination system.

Denoted at 19 is a light source for illumination of the reference mark 17, and it comprises an LED, for example. Denoted at 18 is a lens. Light from the light source 19 is collected by the lens 18, and it is directed to illuminate the reference mark 17. Denoted at 20 is a beam splitter for the reference mark observation. It serves to reflect the light from the reference mark 17 and to direct it to an erector lens 21. The erector lens 21 serves to image the reference mark 17 as well as the mark 4 on the wafer 3 surface, upon an image pickup surface of a CCD camera 22.

While the detecting means 101 of this embodiment comprises those elements as described above, the objective lens 12, the erector lens 21 and the CCD camera 22 are also components of an observation system.

In operation of this embodiment, the non-exposure light (illumination light) emitted from the light source means 14a goes by way of the lens 15, hologram H1, lens L2, hologram H2, beam splitter 16, lens L3, mirror 11 and projection lens system 5, in this order, and it illuminates the AA mark 4 on the wafer 3. The observation imagewise information of the AA mark on the wafer 3 is imaged upon the CCD camera 22, by way of the projection lens system 5, mirror 11, lens L3, beam splitter 16, beam splitter 20 and erector lens 21, in this order.

The projection lens system has been corrected with respect to the exposure light (sensitizing light) to assure projection of an electronic circuit pattern of the reticle 8 upon the wafer 3. For this reason, when non-exposure light goes through the projection lens system 5, various aberrations are produced.

In this embodiment, these aberrations produced by the projection lens system 5 are corrected by the objective lens 12. Thus, a good observation image of the AA mark 4 is produced upon the CCD camera 22.

On the other hand, the reference mark 17 is illuminated with the light coming from the reference mark illuminating light source (LED) 19 and collected by the lens 18. The reference mark is then imaged upon the CCD camera 22 by way of the beam splitter 20 and the erector lens 21.

The position upon the CCD camera 22 of the observation image of the AA mark of the wafer 3, as imaged on the CCD camera 22, is measured by using a signal processing means (not shown). Also, the position upon the CCD camera 22 of the projected image of the reference mark 17, which is fixed, is measured by using the signal processing means. Then, by comparing the position of the image of the AA mark 4 with the position of the image of the reference mark 17, both on the CCD camera, accurate positional information related to the X-Y stage 1 is produced. On the basis of this, correct and precise alignment of the reticle 8 with the wafer 3 is performed.

After the alignment of the reticle 8 with the wafer 3 is accomplished, the circuit pattern of the reticle 8 is printed by projection exposure. After such an exposure process, the wafer 3 is processed by a development procedure and so on, by which semiconductor devices are produced.

In this embodiment, the holograms H1 and H2 are disposed at the positions Fs and $As_1$ which are optically conjugate with the object surface 4 (surface to be illuminated) and the pupil plane 14c of the illumination system, respectively, wherein the holograms H1 and H2 serve to expand the received light by an angle as required.

The optical function of the hologram used in this embodiment will now be described in more detail.

Figure 14:
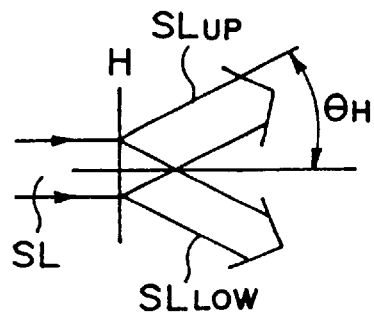
FIGS. 14 and 15 are schematic views, respectively, each for explaining the optical function of a hologram.

FIG. 14 is a schematic view of light paths in a case where parallel light is projected on a hologram H. The hologram H serves to diffract the parallel light SL with angles $\pm\theta_H$ and to expand it into light $SL_{UP}$ and light $SL_{LOW}$. In other words, the hologram H acts as an optical element having a function for amplitude-dividing the light and for deflecting divided light beams in predetermined directions.

Figure 15:
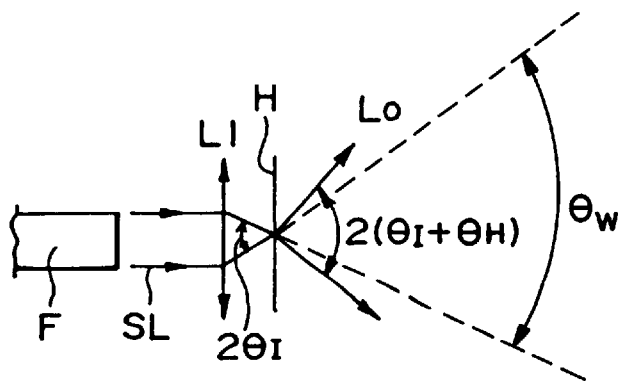

FIG. 15 is a schematic view of light paths in a case where light SL from a fiber F is inputted into the hologram H by way of a lens L1. The light flux SL from the fiber F is projected upon the hologram H with an expansion angle $\pm\theta_I$ due to the optical system L1. If the light scattering performance (off-axis aberration) of the hologram H with respect to the incidence angle is constant within the angular range $\pm\theta_I$, the expansion angle of light passed through the hologram H becomes equal to $+(\theta_I+\theta_H)$. Even if there is a difference in intensity within the angular range of the light incident, with respect to each light beam, the light is expanded by an angle $\pm\theta_H$. As a result, the intensities of light rays of different angles are averaged as a whole, such that they are made uniform.

This uniforming effect is higher with a larger angle $\theta_H$. However, if the angle $\theta_I+\theta_H$ is larger than an angle $\theta_W$ which is desired to be used practically, it causes a loss of light quantity. As a matter of course, this applies also to a case where the angle $\theta_I$ is large.

The relationship of the values of the angles $\theta_I$ and $\theta_H$ to the angle $\theta_W$ is attributable to the non-uniformness resulting from the intensity difference within the angle of incident light. In other words, the optimum angle $\theta_H$ changes with the dispersion of the fiber F. In the present embodiment, holograms with various angles $\theta_H$ are prepared and, among them, one which assures uniforming with a least loss of light quantity is selected by experiments.

Next, on the basis of specific numerical values, the relation of angles $\theta_W$, $\theta_I$ and $\theta_H$ as well as the structure of the observation system of the present embodiment will be explained.

In FIG. 12, it is assumed that an image of the object surface 4 is to be observed upon a CCD camera of ⅔ inch with an N.A. (numerical aperture) of 0.5 (having a photo-electric conversion surface of 6.6×8.8 mm²), at an optical magnification of 100×. Thus, the detectable range upon the object surface 4 is 66×88 $\mu m^2$ ($\phi 110$ $\mu m$) which results from dividing the range 6.6×8.8 mm² by the optical magnification.

The light from the light source means 14a such as a halogen lamp is directed by the fiber bundle 14b to the optical system. Here, it is to be noted that this fiber bundle is disposed at a pupil plane of the whole illumination system so that it serves to perform Kohler illumination.

Referring back to FIG. 13, the structure of this illumination system will be explained. In FIG. 13, the lens groups $L_1$, $L_2$, $L_3$, $L_4$ and $L_5$ have focal lengths $f_1$, $f_2$, $f_3$, $f_4$ and $f_5$, respectively. The principal point spacing between the lens group $L_i$ and the lens group $L_{i+1}$ is $e_{i+1}$. The spacing from the light exit surface 14c of the fiber 14b to the lens group $L_1$ is $e_1$. The spacing from the lens $L_5$ to the wafer 3 is $e_6$.

In this embodiment, the relationship between the focal lengths $f_1$, $f_2$, $f_3$, $f_4$ and $f_5$ and the spacings $e_1$, $e_2$, $e_3$, $e_4$, $e_5$ and $e_6$ is such as satisfying a cascade arrangement (an arrangement wherein the air spacing corresponds the sum of the focal lengths of the lens groups at the opposite sides of the air spacing). More specifically:

$e_1 = f_1$
$e_2 = f_1 + f_2$
$e_3 = f_2 + f_3$
$e_4 = f_3 + f_4$
$e_5 = f_4 + f_5$
$e_6 = f_5$

When the optical arrangement of the illumination system is structured under a condition that a portion of a fiber bundle with a light exit surface 14c of a diameter of 3 mm is to be used, the focal length $f_{ilm}$ of the whole system is as follows:

$$\tfrac{3}{2} = f_{ilm} \tan\{\sin^{-1}(0.5)\}.$$

It follows that $f_{ilm} = 2.598$ (mm).

As regards the angle $\alpha_0$ to be used at the light exit surface 14c of the fiber 14b:

$$f_{ilm}/0.11 = 1/(2 \tan \alpha_0).$$

Therefore, $\alpha_0 = 1.21$ (deg.)

The two holograms H1 and H2 are disposed at he plane Fs conjugate with the wafer 3 and the plane $As_1$ conjugate with the pupil 14c of the illumination system, respectively. If the order of the plane Fs conjugate with the wafer 3 and the plane $As_1$ conjugate with the pupil is reversed (that is, if, from the fiber 14b side, the plane $As_1$ conjugate with the pupil and the plane Fs conjugate with the wafer 3 are disposed in this order), the shape of the hologram H1 disposed at the plane Fs conjugate with the wafer 3 is reflected upon the wafer 3 surface. This causes non-uniformness in illuminance. The averaging effect is larger with larger expansion angles $\theta_1$ and $\theta_2$ by these holograms. However, it causes a larger loss of light quantity.

For this reason, optimum values are determined in consideration of the non-uniformness in intensity with the incidence angles $\alpha_1$ and $\alpha_2$. As a numerical example, the following relations are satisfied:

$f_1 = f_2 = 50$
$f_3 = 383.9$
$f_4 = 100$
$f_5 = 10$ (mm).

Under these conditions, it follows that:

$\alpha_1 = 1.72$
$\alpha_2 = \tfrac{1}{21}$ (deg.).

In this case, the angles $\theta_1$ and $\theta_2$ for the light expansion by the holograms H1 and H2 become, at the maximum, equal to the values of $\alpha_1$ and $\alpha_2$, respectively. However, according to experiments in relation to the non-uniformness of the fiber F, it has been confirmed that a sufficient averaging effect is attainable and thus a superior result is obtainable with the angles $\theta_1$ and $\theta_2$ each being on an order of 0.5–1 degree. The above-described numerical example is the one that is based on the case where, even though the holograms H1 and H2 are unused, the whole regions of the pupil and the surface to be illuminated are irradiated with light.

It is to be noted that the principle of this embodiment is not limited to the example described above. The advantageous results of this embodiment are attainable provided that the whole region of the pupil and the surface to be illuminated is irradiated with light passed through the holograms H1 and H2.

The light made uniform by the two holograms H1 and H1 is then restricted by a predetermined stop diameter $D_2$ at the pupil plane $As_2$ which is optically conjugate with the pupil plane $As_1$. If, in this numerical example, the observation system has an N.A. of 0.5 and the illumination partial coherence value $\sigma$ is 1, then it follows that:

$$D_2 = 2\tan(30) \times 10 = 11.55 \text{ (mm)}.$$

In this embodiment, in view of the cost of the production of such a hologram and versatility thereof, the arithmetic hologram method is used.

In order to enhance the transmissivity of such a hologram up to close to 100%, a phase type hologram method may preferably be used wherein a surface recess and protrusion (irregularity) is defined on the surface of a hologram material by which a phase difference is provided in accordance with the magnitude of the surface level difference.

Also, for hologram formation, an arithmetic hologram may be used in accordance with which, practically, a laser may be provided on an optical bench as a light source. The arithmetic hologram method may provide a higher efficiency because of a wider latitude with respect to changing the light expansion angle or direction (e.g., only in the negative direction) or changing the wavelength, for example.

Practically, there is a possibility that, if light is inputted with an angle wider than the incidence angle at the time the hologram is produced, a desired expansion angle is not provided. On such occasion and if the angle of the light emitted from the fiber is not restricted (there are many cases wherein, even after passage through the fiber, the angular characteristic as the light is incident is preserved, to a large degree, in the emission angle characteristic), a pupil plane may preferably be defined within the structure of the lens group L1 or L2 and a predetermined stop $As_0$ may preferably be defined thereupon. This enables restricting the light flux having been expanded to $\pm(\theta_1+\alpha_1)$ by the hologram H1 to thereby control the incidence angle upon the hologram H2, to about $\alpha_2$ (it assures uniformness after passage of the hologram H2).

In this embodiment, as described, hologram means that assures diffraction only with respect to a desired angle or angles to provide expansion of light, is disposed in the light path, such that observation of an alignment mark on the wafer 3 surface is performed with uniform light and with a least loss of light quantity.

Particularly, plural holograms having different diffraction angles may be in this embodiment to ensure uniformness of light in a case wherein a fiber is used in the illumination system. Thus, superior illumination performance is attainable.

Figure 16:
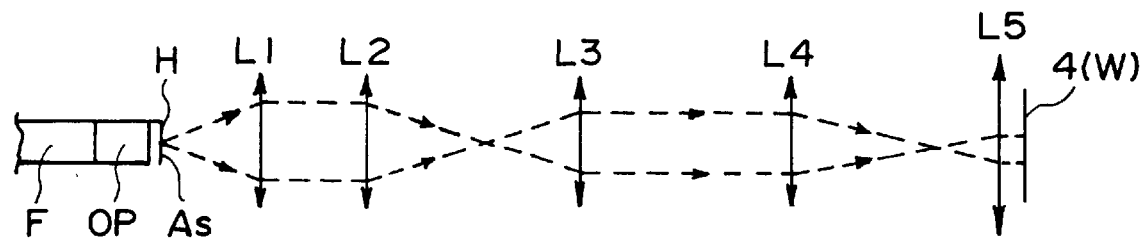
FIG. 16 is a schematic view of a portion of an illumination system according to a second embodiment of the present invention.

FIG. 16 is a schematic view of a main portion of an illumination system included in a second embodiment of the present invention.

As compared with the first embodiment, in this embodiment, one optical pipe OP is provided at the light exit surface of the fiber F and, additionally, a hologram H is disposed at the light exit surface As (pupil plane of the illumination system), by which uniformness of light is assured. The remaining portion of this embodiment has substantially the same structure as that of the first embodiment.

Generally, when a halogen lamp is used as an illumination light source, in most cases, a bundle fiber is used as the fiber. The bundle fiber comprises a combination of a large number of single fibers and, thus, it has light transmitting portions and light non-transmitting portions. Such a difference in transmissivity in single-fiber groups or any local breakage of fibers occurring after assembling, may also cause non-uniformness of light upon the pupil plane or upon the surface being illuminated. This is a bar to the high precision alignment operation.

In this embodiment, one hologram and one optical pipe are used to avoid this problem.

As shown in FIG. 16, in this embodiment, the optical pipe OP is disposed just after the light exit surface of the bundle fiber F. The light passed through the fiber F and entering the optical pipe OP is totally reflected by the side face of the optical pipe OP, and it is emitted from the end of the optical pipe OP without loss of light quantity. At the light exit end of the optical pipe OP, individuals of the single fibers are not distinguishable, though they are so at the light exit end of the bundle fiber.

Non-uniformness of intensity produced by the individual single fibers is thus removed in this embodiment, in the manner described above. If, however, the angle used is small, the intensity uniforming may be insufficient, as described hereinbefore in relation to the optical pipe.

In this embodiment, in consideration thereof, the exit of the optical pipe OP provides a pupil plane As of the illumination system, and a hologram H is disposed there to assure satisfactory light uniforming. The angle of light deflected by the hologram H is changeable depending on the error of the illumination system, as described hereinbefore.

Like a case where, when two holograms are used, one hologram is disposed at the pupil plane $As_1$, if only one hologram is used and placed at a plane optically conjugate with the surface being observed, the pattern is transferred to the surface being observed and, thus, non-uniformness of illuminance may result.

In consideration of this, when only one hologram H is used, preferably it may be disposed at the pupil plane, rather than at the plane conjugate with the surface to be illuminated.

Figure 17:
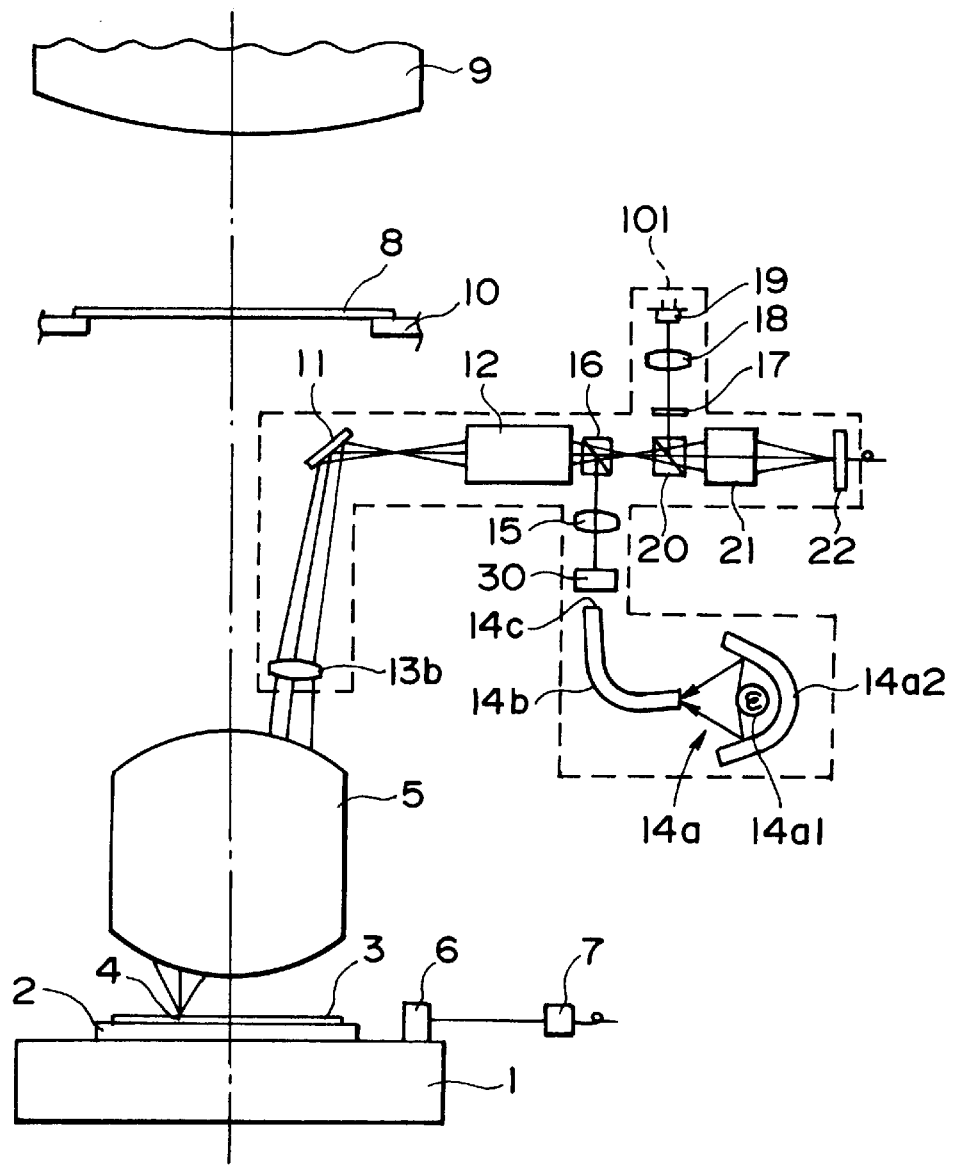
FIG. 17 is a schematic view of a main portion of a projection exposure apparatus according to a third embodiment of the present invention.

FIG. 17 is a schematic view of a main portion of a projection exposure apparatus according to a third embodiment of the present invention. FIG. 18 is an enlarged view of a portion of FIG. 17. In these drawings, reference numerals like those of FIG. 12 are assigned to corresponding elements.

As compared with the first embodiment, in this embodiment, a spherical member 30 which comprises a plurality of transparent sphere or semi-sphere elements 31, each having a diameter of about 0.2–1 mm, and being accommodated in a casing 32, is used as a uniforming member in the illumination system, in place of the hologram. This sphere member 30 is disposed at the light exit surface 14c of a fiber 14b. The remaining portion of this embodiment has substantially the same structure as that of the first embodiment.

As best seen in FIG. 18, the sphere member 30 of this embodiment has a structure that a number of sphere glass elements 31 is housed in the casing 32 of cylindrical shape whose inside wall has been formed with a high reflectivity such as by using aluminum (Al), for example.

As shown in FIG. 18, when light from the light exit surface 14c of the fiber 14b enters the sphere member 30, the light is refracted by the sphere glasses 31 plural times. Light rays impinging on the wall of the cylinder are reflected by the reflection surface on the inside wall thereof, or they are refracted by the sphere glasses plural times.

The light passed through the sphere member 30 after refraction, by plural times, by the sphere glasses 31, has a uniform distribution. Thus, by designing the illumination system so that the exit of the sphere member defines a pupil plane, an observation system with a uniform detection waveform within its view field is assured.

Generally, it is possible that, when a fiber bundle is used as a fiber in an illumination system to perform Kohler illumination, due to the packing rate of the bundle, there is an angle with respect to which no light ray is present. Also, breakage of a portion of the fiber bundle may produce non-uniformness.

In consideration of such a possibility, in this embodiment, the sphere member 30 of the structure such as shown in FIG. 18 is used as uniforming means. Thus, an illumination system by which good uniformness is maintained upon the surface to be illuminated and upon the pupil plane, is accomplished.

When, in this embodiment, a low power light source means is to be used, the surface of each sphere glass element may preferably be provided with an anti-reflection coating. This enables uniformness efficiently.

FIG. 19A is a schematic view of a main portion of a sphere member 40 according to another embodiment. FIG. 19B shows the sphere member 40 in a state in which it is disposed at the light exit surface 14c of the fiber 14b.

In this embodiment, the sphere member 40 comprises nineteen (19) sphere glass elements 31 which are accommodated within a frame 42 of hexagonal shape, in a tight grid-like fashion. The size of the hexagonal frame 42 is made larger than the diameter of the light exit surface 14c of the fiber 14b. This is effective to omit the necessity of providing the inside of the frame 42 with a high reflectivity surface.

It is to be noted, that in this embodiment, plural sphere members 40 (e.g., two or three) may be used and accumulated one upon another at the light exit surface 14c. A multi-stage structure of sphere members 40 may be used in accordance with the uniformness as required, and it accomplishes optimum uniformness with optimum structure.

Figure 20:
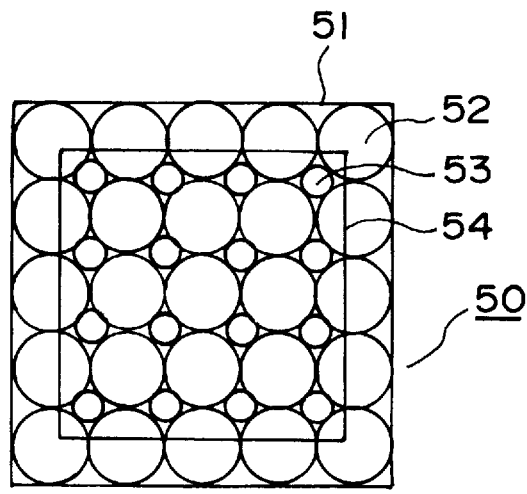
FIG. 20 is a schematic view for explaining a further example of a sphere member structure of the FIG. 17 embodiment.

FIG. 20 is a schematic view of a main portion of a sphere member 50 according to a further embodiment. In this embodiment, plural sphere elements 52 and 53 having different sizes are accommodated tightly within a square frame 51. While two types of sphere elements are used in this embodiment, three or more types may be used. This arrangement facilitates and simplifies the provision of an illumination system of high uniformness. Also, use of the square frame 51 is effective to ease alignment of the uniforming member with the fiber.

Figure 21:
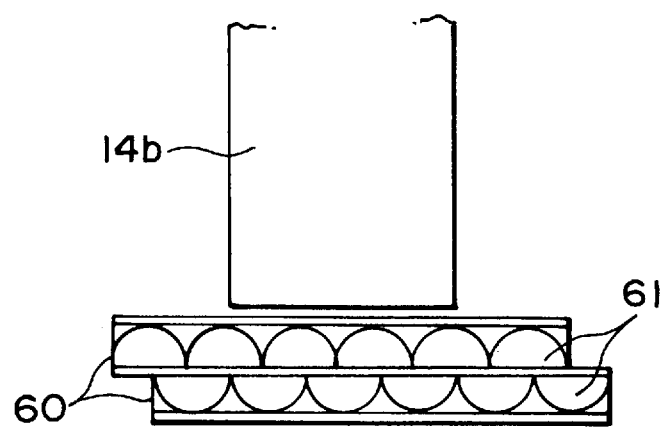
FIG. 21 is a schematic view for explaining a yet further example of sphere member structure of the FIG. 17 embodiment.

FIG. 21 is a schematic view of a main portion of a sphere member 60 according to a yet further embodiment. Denoted in the drawing at 61 are transparent semi-sphere elements which are accommodated in a square or hexagonal frame, to provide the sphere member 60. In this embodiment, plural sphere members 60 each being such as above are used and accumulated into two stages, with a shift in X and Y directions, perpendicular to the optical axis, of an amount corresponding to the radius of each semi-sphere element. While two sphere members 60 are used in this embodiment, three or more sphere members may be used. Also, in place of semi-sphere elements or sphere elements, an array of selfoc lenses or an integral structure of a micro-lens array may be used.

FIG. 22A is a schematic view of a portion of an illumination system according to a fourth embodiment of the present invention. In this embodiment, the sphere member 30 of the third embodiment is replaced by a rotatable disk or pinhole member 71, such as shown in FIG. 22B, which is disposed at a plane optically conjugate with the object surface 4. The rotatable disk 71 is formed with a number of pinholes which are distributed like an eddy. The disk 71 can be rotated by driving means 72, thereby providing uniforming means. The remaining portion of this embodiment has substantially the same structure as that of the third embodiment. Denoted in FIG. 22A at 14b is a fiber, and denoted at 15 is a lens. They have similar functions as those of the corresponding elements of FIG. 17.

The illumination system of this embodiment performs Kohler illumination. When Kohler illumination is used, the Fourier transformation plane at the image plane corresponds to a pupil plane. If a pinhole plate is disposed at a plane conjugate with the image plane, a uniform distribution is provided at the pupil plane (Fourier transformation plane), since the Fourier transformation having a delta function provides uniform distribution. A rotatable disk having a number of pinholes such as shown in FIG. 22B is displaced at a plane conjugate with the image plane, and illumination of a two-dimensional region is performed. The disk may be rotated more than one revolution within the period of a charging-up time of the CCD camera 22, by which the surface 4 is illuminated two-dimensionally with a uniform angular characteristic.

If, in this embodiment, the illumination region on the surface 4 of the object extends in a one-dimensional direction only, a transmission type diffraction grating having an elongated light transmitting portion, extending in one direction, may be used in place of the pinholes. By moving the grating by a simple motion in a direction perpendicular to the one direction, uniform illumination is attainable.

FIG. 23 is a schematic view of a portion of an illumination system according to a fifth embodiment of the present invention. In this embodiment, in place of the sphere member 60 of the third embodiment of FIG. 17, a lens 81 and a digital micro-mirror device are used to provide uniforming means. The remaining portion of this embodiment has substantially the same structure as that of the third embodiment.

Denoted in FIG. 23 at 14b is a fiber, and denoted at 15 is a lens, corresponding to those of FIG. 17. The light exit surface 14c of the fiber 14b and the digital micro-mirror device 82 are placed in a Scheimpflug's condition. Details of the digital micro-mirror device are discussed in "IEEE SPECTRUM", November 1993, and explanation of it will be omitted 20 here.

In this embodiment, the exit surface 14c of the fiber 14b and the digital micro-mirror device 82 are disposed in an optically conjugate relationship. By changing the reflection angle of each element of the digital micro-mirror device 82 to correct and provide a uniform angular characteristic of the fiber 14b, uniformness upon the pupil plane and the surface to be illuminated is accomplished. Also, the angle of each element of the digital micro-mirror device 82 in this embodiment is changed so that a symmetric waveform is produced from the alignment mark 4.

In this embodiment, the end face 14c of the bundle fiber 14b and the reflection surface of the digital micro-mirror device 82 are placed in an imaging relationship (Scheimpflug's condition) by means of an optical system 81. Here, the optical magnification is so set that the individual fibers of the bundle fiber 14b are coordinated with the individual elements of the digital micro-mirror device 82. The reflection angle of each element of the digital micro-mirror device 82 is determined so as to remove the non-uniformness of angular characteristic of the fiber 14b.

More specifically, the central rays of light as reflected by each element of the digital micro-mirror device 82 go through the point of intersection between the optical axis of the objective lens 12 and the object 4 being observed. For this reason, for determination of the reflection angle of each element of the digital micro-mirror device 82, a photoelectric converting device such as a silicon sensor may preferably be disposed at that point of intersection. The angle defined as the output of such a photoelectric converting device becomes highest while changing the reflection angle of the element, corresponds to a desired angle. As regards the reflection angles of the other elements, they may preferably be set so that the light from the fiber 14b does not impinge on the object 4 being observed.

While the invention has been described with reference to the structures disclosed herein, it is not confined to the details set forth and this application is intended to cover such modifications or changes as may come within the purposes of the improvements or the scope of the following claims.

What is claimed is:

1. An illumination system for illuminating an object, said system comprising:

light source means for providing light;

an illumination optical system for directing the light from said light source means toward the object to illuminate the same;

a first optical element provided in a portion of a light path of said illumination optical system and at a position optically conjugate with the object with respect to said illumination optical system, said first optical element having a function for amplitude-dividing the light and for deflecting a divided light ray to a predetermined directions; and a second optical element provided at a position in a portion of the light path of said illumination optical system, closer to the object side as compared to said first optical element, and disposed on a pupil plane of said illumination optical system, said second optical element having a function for amplitude-dividing the light and for deflecting a divided light ray to a predetermined direction.

2. A system according to claim 1, further comprising a fiber for directing the light from said light source means to said illumination optical system.

3. A system according to claim 2, wherein said fiber has a light exit surface which is disposed at a pupil plane of said illumination optical system.

4. A system according to claim 2, further comprising an optical pipe disposed in a portion of a light path between said illumination optical system and a light exit surface of said fiber, wherein said optical pipe has a light exit surface disposed at a pupil plane of said illumination optical system.

5. A system according to claim 1, wherein said first and second optical elements comprise an arithmetic hologram.

6. A system according to claim 1, wherein said first and second optical elements comprise a phase type hologram.

7. An illumination system for illuminating an object, comprising:

light source means for providing light;

an illumination optical system for directing the light from said light source means toward the object to illuminate the same;

a fiber for directing the light from said light source means to said illumination optical system; and a rotatable member disposed at a light exit side of said fiber and having a plurality of openings for transmitting the light from said fiber, wherein said rotatable member has a light exit surface disposed at a pupil plane of said illumination optical system.

8. A system according to claim 7, wherein said openings of said rotatable member are defined by pinholes distributed like an eddy.

9. A system according to claim 7, wherein said openings of said rotatable member provide a transmission type diffraction grating.

10. A projection exposure apparatus for illuminating a first object and/or a second object, for observing the first object and/or the second object, for aligning the first and second objects with each other and for projecting a pattern of the first object to the second object through a projection optical system, said apparatus comprising:

light source means for providing light;

an illumination optical system for directing the light from said light source means toward the first or second object to illuminate the same;

a first optical element provided in a portion of a light path of said illumination optical system and at a position optically conjugate with the first or second object with respect to said illumination optical system, said first optical element having a function for amplitude-dividing the light and for deflecting a divided light ray to a predetermined direction; and a second optical element provided at a position in a portion of the light path of said illumination optical system, closer to the first object side and/or the second object side as compared to said first optical element, and disposed on a pupil plane of said illumination optical system, said second optical element having a function for amplitude-dividing the light and for deflecting a divided light ray to a predetermined direction.

11. An apparatus according to claim 10, further comprising a fiber for directing the light from said light source means to said illumination optical system.

12. An apparatus according to claim 11, wherein said fiber has a light exit surface which is disposed at a pupil plane of said illumination optical system.

13. An apparatus according to claim 11, further comprising an optical pipe disposed in a portion of a light path between said illumination optical system and a light exit surface of said fiber, wherein said optical pipe has a light exit surface disposed at a pupil plane of said illumination optical system.

14. A system according to claim 10, wherein said first and second optical elements comprise an arithmetic hologram.

15. A system according to claim 10, wherein said first and second optical elements comprise a phase type hologram.

16. A projection exposure apparatus for illuminating a first object and/or a second object, for observing the first object and/or the second object, for aligning the first and second objects with each other and for projecting a pattern of the first object to the second object through a projection optical system, said apparatus comprising:

light source means for providing light;

an illumination optical system for directing the light from said light source means toward the first or second object to illuminate the same;

a fiber for directing the light from said light source means to said illumination optical system; and a rotatable member disposed at a light exit side of said fiber and having a plurality of openings for transmitting the light from said fiber, wherein said rotatable member has a light exit surface disposed at a pupil plane of said illumination optical system.

17. An apparatus according to claim 16, wherein said openings of said rotatable member are defined by pinholes distributed like an eddy.

18. An apparatus according to claim 16, wherein said openings of said rotatable member provide a transmission type diffraction grating.

19. A semiconductor device manufacturing method for illuminating a reticle and/or a wafer, for observing the reticle and/or the wafer, for aligning the reticle and the wafer with each other, for projecting a pattern of the reticle to the wafer through a projection optical system, and for developing the wafer for production of a semiconductor device, said method comprising the steps of:

illuminating the reticle and/or the wafer with light from a light source and through an illumination optical system;

amplitude-dividing the light and deflecting a divided light ray to a predetermined direction with a first optical element disposed in a portion of a light path of the illumination optical system and at a position optically conjugate with the reticle or the wafer with respect to the illumination optical system; and amplitude-dividing the light and deflecting a divided light ray to a predetermined direction with a second optical element provided at a position in a portion of the light path of the illumination optical system, closer to the first object side and/or the second object side as compared to the first optical element, and disposed on a pupil plane of the illumination optical system.

20. A semiconductor device manufacturing method for illuminating a reticle and/or a wafer, for observing the reticle and/or the wafer, for aligning the reticle and the wafer with each other, for projecting a pattern of the reticle to the wafer through a projection optical system, and for developing the wafer for production of a semiconductor device, said method comprising the steps of:

illuminating the reticle and/or the wafer with light from a light source and through an illumination optical system;

directing, through a fiber, the light from the light source to the illumination optical system; and rotating a rotational member disposed at a light exit side of the fiber and having a plurality of openings for transmitting the light from the fiber, wherein the rotatable member has a light exit surface disposed at a pupil plane of the illumination optical system.

* * * * *

UNITED STATES PATENT AND TRADEMARK OFFICE
CERTIFICATE OF CORRECTION

PATENT NO. : 5,808,724
DATED : September 15, 1998
INVENTOR(S) : HIDEKI INA, ET AL.

It is certified that error appears in the above-identified patent and that said Letters Patent is hereby corrected as shown below:

COLUMN 10,
Line 7, "the sum" should read --to the sum--; and
Line 33, "he" should read --the--.

COLUMN 11,
Line 56, "be" should read --be used--.

COLUMN 15,
Line 12, "The angle" should read --The angle, which is--; and
Line 37, "directions;" should read --direction;--.

Signed and Sealed this

Sixth Day of July, 1999

Attest:

Q. TODD DICKINSON

Attesting Officer   Acting Commissioner of Patents and Trademarks